United States Patent [19]

Davis

[11] 4,005,342

[45] Jan. 25, 1977

[54] INTEGRATED CIRCUIT OVERVOLTAGE PROTECTION CIRCUIT

[75] Inventor: William Folsom Davis, Tempe, Ariz.

[73] Assignee: Motorola, Inc., Chicago, Ill.

[22] Filed: Nov. 15, 1974

[21] Appl. No.: 524,186

Related U.S. Application Data

[63] Continuation of Ser. No. 332,949, Feb. 15, 1973, abandoned.

[52] U.S. Cl. .............................. 317/16; 307/10 R; 317/31
[51] Int. Cl.² ........................................ H02H 3/22
[58] Field of Search ............ 317/16, 31, 33 R, 50; 307/10 R; 322/28

[56] References Cited

UNITED STATES PATENTS

| | | | |
|---|---|---|---|
| 3,581,150 | 5/1971 | Kirk et al. | 317/16 |
| 3,585,453 | 6/1971 | Kawai | 317/31 |
| 3,599,042 | 8/1971 | Andrews | 317/16 |
| 3,668,545 | 6/1972 | Von Recklinghausen | 317/16 X |
| 3,868,563 | 2/1975 | Hirata | 322/28 |

*Primary Examiner*—Harry Moose
*Attorney, Agent, or Firm*—Charles R. Hoffman

[57] ABSTRACT

An overvoltage protection circuit in an integrated circuit for increasing the breakdown voltage of the integrated circuit between first and second terminals thereof. Diode-connected transistors are connected in series between the first terminal and a resistor. The resistor is connected to the base of a first transistor having its emitter connected to the second terminal and its collector connected to the base of a second transistor having its emitter connected to the second terminal and its collector connected to the first terminal. If an overvoltage applied between the first and second terminals exceeds the sum of the emitter-base reverse breakdown voltages of the diode-connected transistors, current flows into the base of the first transistor, causing it to saturate, thereby preventing the emitter-base junction of the second transistor from being forward biased. The collector to emitter breakdown voltage of the second transistor is thereby increased.

5 Claims, 5 Drawing Figures

INTEGRATED CIRCUIT OVERVOLTAGE PROTECTION CIRCUIT

This is a continuation of application Ser. No. 332,949, filed Feb. 15, 1973, now abandoned.

BACKGROUND OF THE INVENTION

Integrated circuits may be advantageously utilized in modern automotive electrical systems, for example, in ignition systems or in seat belt interlock systems, affording substantial cost savings. However, the automotive environment has been found to be an exceptionally harsh one for semiconductor circuits in general, and for integrated circuits in particular. As a result, unexpected problems and requirements have arisen in the design of integrated circuits which must perform reliably in automotive electrical systems and in other high-noise environments. A wide range of temperatures may occur in the automotive environment. Further, a wide range of spurious signals typically occur throughout the wiring of an automotive electrical system. For example, relatively low energy signals of either positive or negative polarity having magnitudes of several hundred volts, hereinafter referred to as "noise" signals, typically occur on wiring lines connecting various sensors to input terminals of integrated circuit devices. Such noise signals may cause malfunctions in the operation of prior art integrated circuit devices, or may even cause destruction of them, and further may destroy discrete semiconductor devices such as power transistors controlled by the integrated circuit. Further, discontinuities in the main power lines of an automotive electrical system, such as interruptions in the connection to the 12 volt automobile battery, may cause severe, high-energy transient voltages, hereinafter called "load dump" voltages, of over 100 volts to occur on the main power lines. The load dump transient voltages may destroy the integrated circuit devices of the prior art in the absence of expensive external protective measures.

Prior art overvoltage protection systems for integrated circuits have typically involved used of an external zener diode connected between the power supply terminals and connected in series with a resistor to the voltage source. During an excessive positive overvoltage, the zener diode breaks over, and the resistor limits the current therethrough. However, especially in automotive applications, the value of the external resistor is necessarily low to prevent a large voltage drop which would impair performance of the integrated circuit. As a result, very large currents flow through the zener diode under breakover conditions, and high cost zener diodes having high power dissipation capability are required. The present invention solves these problems by providing circuitry within the integrated circuit chip which increases the integrated circuit's capability for withstanding high voltages from $BV_{CEO}$ volts to $BV_{CES}$ volts.

SUMMARY OF THE INVENTION

In view of the foregoing considerations, it is an object of this invention to provide an overvoltage protection circuit for integrated circuit devices and discrete semiconductor devices.

It is another object of this invention to provide an overvoltage protection circuit of the type described wherein the capability of the integrated circuit device or semiconductor device to withstand overvoltages is increased.

It is another object of this invention to provide an overvoltage protection circuit of the type described wherein the breakdown voltage of transistors is increased from $BV_{CEO}$ volts to $BV_{CES}$ volts in response to the onset of the overvoltage condition.

It is another object of this invention to provide an overvoltage protection circuit of the type described including a zener diode connected in series with a resistor connected to the base of a transistor in an integrated circuit.

Briefly described, the invention provides an overvoltage protection circuit including a zener diode, a resistor and a first transistor, all on an integrated circuit chip. The cathode of the zener diode is connected to a supply terminal of the integrated circuit, and the anode is connected to one electrode of the resistor. The other electrode of the resistor is connected to the base of the transistor, which has its emitter connected to ground and its collector connected to the base of a second transistor, the second transistor having its emitter connected to ground and its collector connected to the supply terminal. During an overvoltage condition, the zener diode breaks over, causing current to flow through the resistor into the base of the first transistor, which saturates, causing the breakdown voltage capability of the second transistor to increase from $BV_{CEO}$ volts to $BV_{CES}$ volts.

DESCRIPTION OF THE INVENTION

Figure 1:
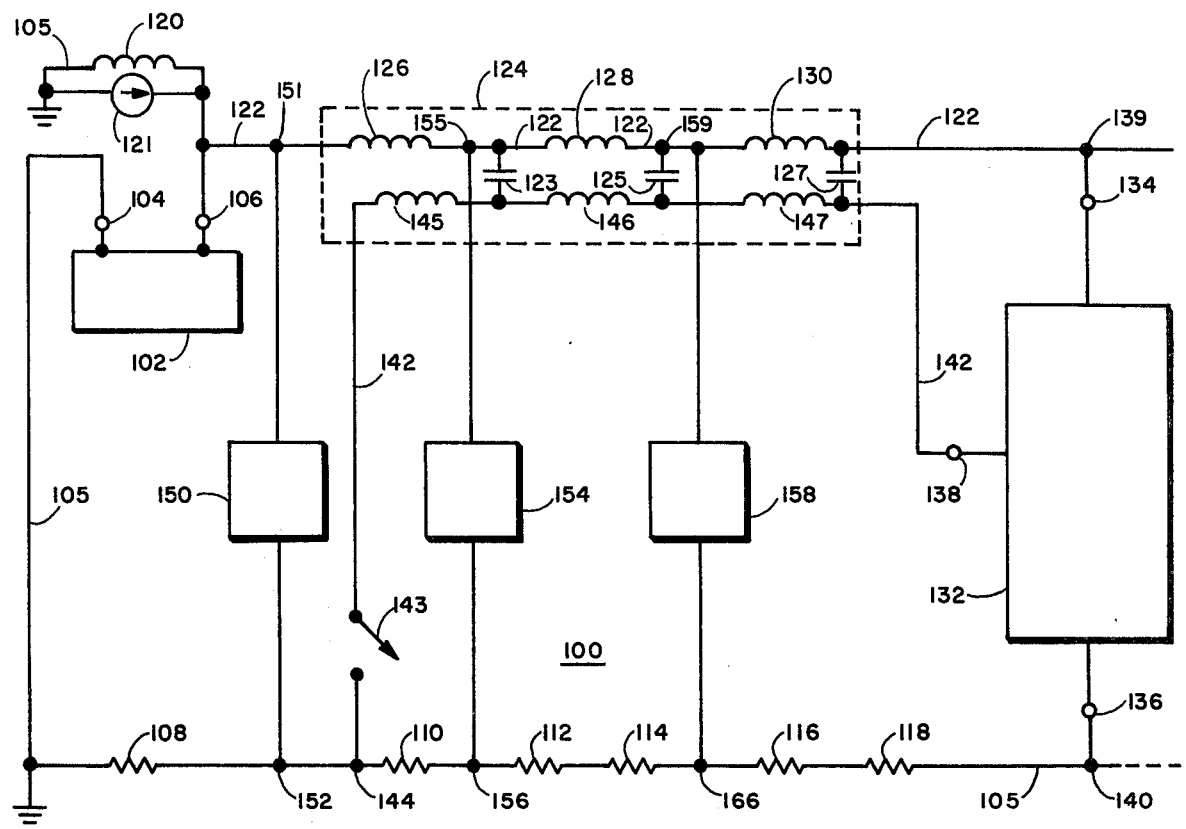
FIG. 1 is a schematic diagram of a model of the automotive electrical environment.

The environment giving rise to the problems solved by the present invention is best described with reference to FIG. 1, which is a schematic model of the automotive electrical environment, and also to FIG. 2, which is graph illustrating the noise and electrical transients occurring in the automotive electrical system of FIG. 1. In FIG. 1, automotive electrical system 100 includes a 12 volt battery 102, which has a negative terminal 104 and a positive terminal 106. Negative terminal 104 is connected to the electrical ground conductor 105 of the electrical system 100. The electrical ground conductor 105 includes the automobile chassis and wires connected to the chassis at various points thereof. In FIG. 1 the chassis resistance is lumped into several discrete resistors 108, 110, 112, 114, 116 and 118. It is known that these resistances may increase in value as corrosion of the chassis occurs and as mechanical conditions weaken various connections in the chassis as the automobile ages. Positive terminal 106 of battery 102 is connected to alternator field coil 120 and the alternator output, represented by current source 121, the other terminals of which are connected to the system ground. Power line 122, hereinafter referred to as the B+ bus, is also connected to positive terminal 106. B+ bus 122 runs through electrical wiring harness 124, along with numerous other wires of the electrical system. The distributed inductance of B+ bus 122 is lumped into several inductances 126, 128 and 130 in the model of FIG. 1. Integrated circuit 132, which has positive power supply terminal 134, ground supply terminal 136, and input terminal 138, is connected between B+ bus 122 at point 139 thereof and ground conductor 105 at point 140 thereof. Input terminal 138 is connected to wire 142 which runs through wiring harness 124 in close proximity to B+ bus 122 and is connected to switch 143. When switch 143 is closed, wire 142 is connected to ground conductor 105 at point 144 thereof. The distributed inductance of wire 142 is lumped into several inductors 145, 146 and 147. Lumped capacitors 123, 125 and 127 represent the capacitive coupling between B+ bus 122 and signal wire 142. Electrical accessory 150 is connected between point 151 of B+ bus 122 and point 152 of ground conductor 105. Second electrical accessory 154, which may, for example, be an air conditioner motor, is connected between point 155 of B+ bus 122 and point 156 of ground conductor 105. Third electrical accessory 158, which may, for example, be a motor operating an electric seat or electric window, is connected between point 159 of B+ conductor 122 and point 160 of ground conductor 105. The various inductances illustrated in FIG. 1 and the mutual coupling therebetween gives rise to a large amount of electrical noise on wire 142 and B+ bus 122 as various electrical accessories are switched on and off. For example, if accessory 158 is operating, a large current flows from terminal 106 through B+ bus 122, inductors 126 and 128 and through resistors 114, 112, 110 and 108 to negative terminal 104. The resistances in ground conductor 105 are typically of sufficiently large value to cause a substantial drop in the ground voltage between point 160 and negative terminal 104. If accessory 158 is suddenly switched off, the change in current through inductors 126 and 128 causes a very large positive transient voltage to appear on point 159 and, also on point 139. Subsequently, a large positive voltage will appear between terminals 134 and 136 of integrated circuit 132. Further, mutual coupling between inductors 126 and 145 and also between inductors 128 and 146 will cause a large positive transient pulse to appear on wire 142 and hence on terminal 138 of integrated circuit 132, especially if switch 143 is open. Similarly, switching the other electrical accessories 150 and 154 on or off may cause positive or negative transient impulses to appear on B+ bus 122, and on terminal 134, and also on wire 142 and terminal 138. In general, it may be seen that any integrated circuit in the electrical system 100 connected distant from battery 102 between B+ bus 122 and ground conductor 105 will experience transient voltages to occur between terminals 134 and 136 when accessories are switched. It is also seen that there will be an uncertain ground reference voltage, due to currents flowing through the distributed resistances 108, 110, etc. Further, any input terminals connected to wires which run through the wiring harness 124 will pick up noises due to mutual inductive and capacitive coupling with B+ bus 122. Another type of noise distinct from that described may occur if the battery is disconnected from the positive terminal 106 while current is flowing through field coil 120. In this case, a high energy, negative transient voltage, called the "load dump" voltage, appears on B+ bus 122.

Figure 2:
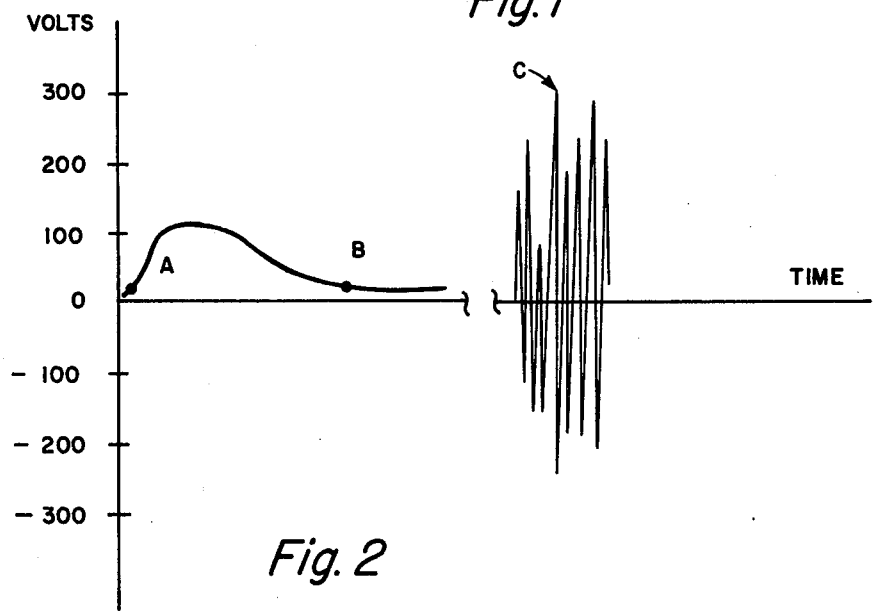
FIG. 2 is a graph illustrating a load dump transient and electrical noise in an automotive electrical system.

Both of the aforementioned types of voltage are illustrated in the graph of FIG. 2. The load dump voltage is illustrated on the lefthand portion of the horizontal axis between points A and B. As seen in FIG. 2, the magnitude of the load dump voltage may exceed 100 volts. The time duration between points A and B is typically half a second. This transient voltage on the B+ bus 122 is sufficient magnitude and energy to destroy prior art integrated circuit devices and low cost discrete semiconductor components such as power transistors, unless some method is employed to protect the integrated circuit. The waveform C illustrated on righthand portion of the graph in FIG. 2 represents high voltage, high frequency noise which may occur on B+ bus 122 and wire 142. The magnitude of the noise represented by waveform C may exceed 300 volts, and typically has a duration of approximately one to 50 microseconds. These pulses also have energy sufficient to sometimes destroy prior art integrated circuit devices. A spectrum analysis of a noise waveform such as is shown in FIG. 2 further illustrates the presence of very high frequency component signals having magnitudes of several volts and frequencies as high as 100 megahertz.. Since bipolar integrated circuits are generally high frequency circuits, they respond to such high frequency noise readily, and various precautions in the design of circuits for use in the automotive environment must be taken to insure that the circuits respond to information input rather than to such noise. Due to the high currents, which may be many amperes, which may flow through the chassis resistance, substantial voltage drops may occur in the ground conductor giving rise to a situation wherein a switch or sensor is referenced to a different ground voltage than the integrated circuit having an input terminal connected by a long wire to the switch or sensor.

Figure 3:
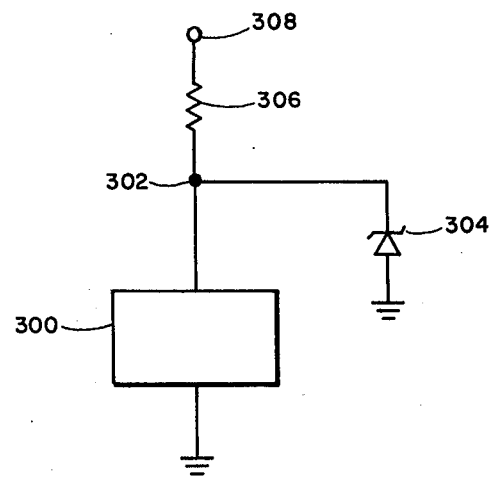
FIG. 3 is a schematic drawing of a prior art overvoltage protection system.

A conventional circuit for protecting integrated circuits from destruction in the above described high noise automotive environment is shown in FIG. 3. Referring to FIG. 3, integrated circuit 300 has one terminal connected to ground and also has its positive power supply terminal 302 connected to the cathode of zener diode 304 and to one electrode of resistor 306. The anode of zener diode 304 is connected to ground, and the other electrode of resistor 306 is connected to B+ bus 308. Zener diode 304 necessarily has a breakdown voltage less than the $BV_{CEO}$ breakdown voltage of transistors on integrated circuit chip 300, so that if B+ bus 308 undergoes a positive transient voltage greater than the zener diode breakdown voltage, none of the transistors on integrated circuit 300 will be destroyed. For negative transient voltages, zener diode 304 will clamp terminal 302 to about 0.75 volts below ground potential. During the breakdown condition of zener diode 304, resistor 306 limits the current therethrough. A serious shortcoming of this protection scheme is that the value of resistor 306 needs to be very low so that integrated circuit 300 may operate under "cold start" conditions. The cold start voltage on B+ bus 308 maybe as low as 4 volts, while the automobile starter is activated in extreme cold weather conditions, so the value of resistor 306 must be very low in order to prevent an excessive voltage drop between B+ bus 308 and terminal 302. As a result, the current through transistor 306 and through zener diode 304 under breakdown conditions is very high, and consequently zener diode 304 must be an expensive device with a high power dissipation capability.

Figure 4:
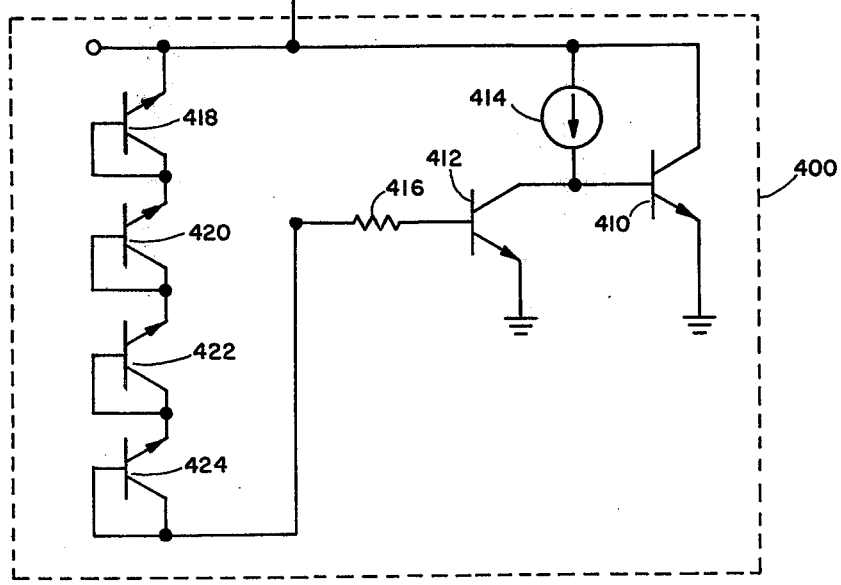
FIG. 4 is a schematic diagram of an embodiment of the invention.

According to the present invention, circuitry is incorporated on the integrated chip, causing the transistors thereon to be able to withstand applied voltages greater in magnitude than that of the load dump transient voltage. This permits utilization of an external zener diode having a breakdown voltage greater in magnitude than that of the maximum load dump transient voltage, but less than that of the minimum $BV_{CES}$ breakdown voltage of the integrated circuit being protected. Then, the external zener diode need only dissipate current caused by the low energy "noise" voltages described hereinbefore. Referring now to FIG. 4, integrated circuit 400 has an external terminal 402 which is connected to the cathode of external zener diode 404 and to resistor 406, the other electrode of which is connected to B+ supply bus 408. The anode of zener diode 404 is connected to ground. Resistor 406 and zener diode 404 form the same external protection circuit as previously described with reference to FIG. 3, except that the zener diode has higher breakdown voltage, but lower power dissipation capability. Integrated circuit 400 has therein transistor 410 having its emitter connected to ground and its collector connected to a terminal 402, so that in the absence of protective measures, an overvoltage greater than $BV_{CEO}$ on B+ bus 408 will destroy transistor 410.

Integrated circuit 400 also includes transistor 412, current source 414, resistor 416, and diode connected transistors 418, 420, 422 and 424. The base of transistor 410 is connected to current source 414 and to the collector of transistor 412, which has its emitter connected to ground. Controlled current source 414 operatively controls transistor 410 to perform the desired circuit function. The base of transistor 412 is connected to one electrode of resistor 416 which has its other electrode connected to diode-connected transistor 424. The collector and base of transistor 424 are connected to resistor 416. The collector and base of transistor 422 are connected to the emitter of transistor 424. The collector and base of transistor 420 are connected to the emitter of transistor 422. Finally, the collector and base of transistor 418 are connected to the emitter of transistor 420, and the emitter of transistor 418 is connected to terminal 402.

The operation is such that when the voltage on B+ bus 408 exceeds the sum of the emitter-base reverse breakdown voltages of transistors 418, 420, 422 and 424 (approximately 28 volts) a reverse current flows through the four diode-connected transistors, through resistor 416 and into the base of transistor 412, thereby causing it to saturate and clamp the base of transistor 410 to approximately ground potential. Thus, the breakdown voltage of transistor 410 is increased to $BV_{CES}$ volts, which may be chosen to be greater than the maximum load dump transient voltage. Clearly, transistor 410 need not be on integrated circuit chip 400, but could be an external power transistor having its collector connected to terminal 402 (or to B+ bus 408), its emitter connected to ground and having its base connected to an additional external terminal connected to the collector of transistor 412. Thus, a much lower cost external power transistor could be utilized, and performance and cost economies may be realized by utilization of the circuitry of the invention, since a high current, high voltage transistor would not be required. A constraint on the design of the transient protection circuit in FIG. 4 is that transistor 412 must be saturated before the voltage at terminal 402 reaches the $BV_{CEO}$ breakdown voltage of transistor 410. Otherwise, transistor 410 may be destroyed before transistor 412 saturates, thereby protecting transistor 410.

Figure 5:
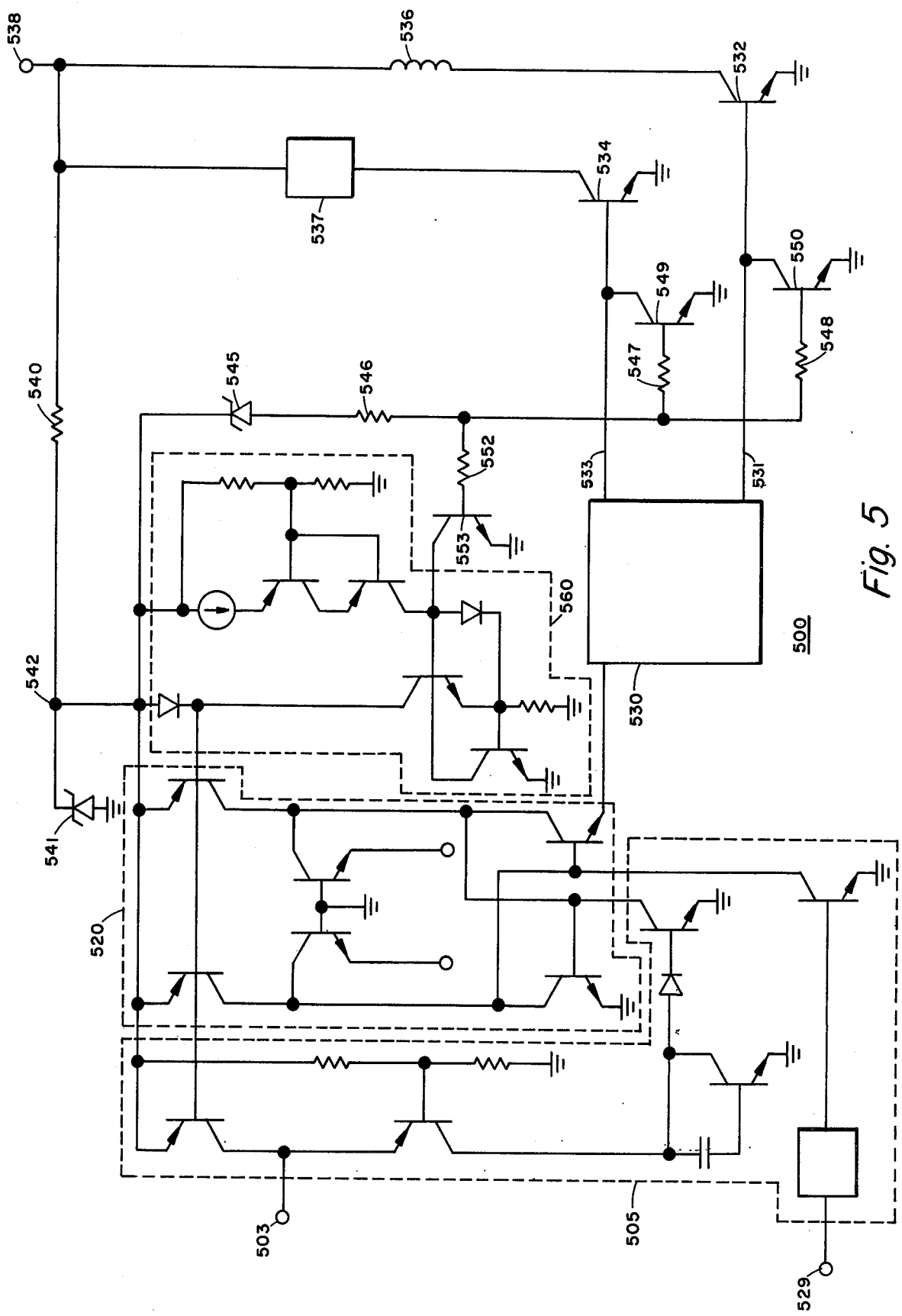
FIG. 5 is a schematic diagram illustrating an embodiment of the invention in an automotive electrical system.

FIG. 5 is a schematic drawing of another embodiment of the invention. Integrated circuit 500 includes input terminals 503 and 529 connected to interface circuit 505. Input signals applied to terminals 503 and 529 are operated on by interface circuit 505 to produce signals which control flip-flop 520, to which interface circuit 505 is connected. Circuit 560 is connected to both interface circuit 505 and flip-flop 520 to provide a reference voltage therefore.

The output of flip-flop 520 is connected to circuit 530, which senses the information stored on flip-flop 520 and converts it to signals to control output transistors 532 and 534. As an example, integrated circuit 500 may be part of an automotive seat belt interlock system, wherein terminal 503 has applied thereto a seat input signal from the automobile driver seat to indicate whether or not the driver has his weight on the seat. Terminal 529 may be an input signal from the seat belt indicating whether or not the seat belt is fastened. With no driver in the driver seat of the automobile, and with the seat belt unfastened, both the seat input and the belt input are ungrounded. When the driver puts his weight on the seat, the seat input 503 is grounded. Then, when the seat belt is buckled, the belt input is grounded, circuit 505 acts to cause a 1 to be stored in the flip-flop. If the order of buckling the seat belt and placing the driver's weight on the seat are reversed, a 0 is written into the flip-flop. The state of the flip-flop is detected through the emitter of transistor 522 by circuit 530, which produces drive current through terminal 531 to turn on output transistor 532 if the seat input 503 and the belt input 529 are properly grounded. If the seat input and belt input are not grounded in the proper sequence, and a 0 is stored, then circuit 530 provides base current only through terminal 533 to output transistor 534. Output transistor 532 enables the starting relay 536 if a 1 is stored in flip-flop 520. On the other hand, output transistor 534 is turned on, thereby activating warning buzzer 537 if a 0 is stored in flip-flop 520.

Both warning buzzer 537 and starter relay 536 present low AC impedances to the collectors of transistors 532 and 534. Thus, if an excessive transient overvoltage appears on B+ bus 538, transistors 532 and 534 may be destroyed, if their emitter-base junctions are not shorted to ground, so that they will break down in the $BV_{CEO}$ mode. Those skilled in the art will recognize that the collector-to-emitter breakdown voltage of a transistor having its base open circuited (i.e., $BV_{CEO}$) is substantially less than its collector-to-emitter breakdown voltage when its base is short circuited to its emitter (i.e., $BV_{CES}$). For example, for a given transistor, $BV_{CEO}$ may be equal to 40 volts, while $BV_{CES}$ may be equal to 130 volts. In the circuit of FIG. 5, output transistors 534 and 532, which may be external to the integrated chip 500, or may be fabricated on the same chip as the integrated circuit, are protected from overvoltages on B+ bus 538 partly by the combination of external resistor 540 and external zener diode 541, which are connected in series between B+ bus 538 and ground. The cathode of zener diode 541 and one terminal of external resistor 540 are connected together at the terminal 542 of integrated circuit 500. Transistors 532 and 534 are further protected from positive overvoltages of B+ terminal 538 by zener diode 545, which consists of four diode-connected NPN transistors connected in series, resistor 546, and resistors 547 and 548. Zener diode 545 of the embodiment of FIG. 5 corresponds to the series connection of transistors 518, 420, 422 and 424 in FIG. 4. B+ bus 538 corresponds to B+ bus 122 in the high-noise automotive environment of FIG. 1. The circuit 530 of FIG. 5 corresponds to controlled current source 414 of FIG. 4, and resistor 546 of FIG. 5 corresponds to resistor 416 of FIG. 4.

The breakdown voltage of zener diode 541 exceeds the $BV_{CEO}$ breakdown voltage of transistors 532 and 534, and protects them only against the "noise", i.e., the high-voltage, low energy transient voltages previously described with reference to FIG. 2. Zener diode 545 has a breakdown voltage of approximately 28 volts, and in conjunction with resistors 546, 547 and 548 and transistors 549 and 550, acts to increase the breakdown voltage of transistors 532 and 534 to $BV_{CES}$ volts when the overvoltage of B+ bus 538 exceeds the breakdown voltage of zener diode 545. This is accomplished by current which is caused to flow through resistor 546 to turn on transistors 549 and 550, thereby causing the base electrodes of transistors 534 and 532, respectively to be clamped to approximately ground potential. Similarly, resistor 552 and transistor 553 act to ground the base of a transistor in circuit 560, protecting it from a transient overvoltage less than $BV_{CES}$. Thus, the transistors are protected from the load dump voltage described earlier with reference to FIG. 2. Resistors 547, 548 and 552 are low in value compared to resistor 546, and are provided to prevent current "hogging" by any one of transistors 549, 550 or 553. Resistor 552 and transistor 553 as shown in FIG. 5 are provided for purposes of illustration of protecting a transistor in, rather than external to integrated circuit 500.

In summary, the invention described herein provides novel circuitry in an integrated circuit which protects transistors in or external to the integrated circuit and connected thereto from being damaged by excessive voltages occurring across terminals of the integrated circuit by detecting a voltage in excess of a predetermined value between said terminals and providing for each such transistor a low impedance path between its base and emitter, thereby increasing the breakdown voltage of each transistor to $BV_{CES}$ volts.

Although this invention has been illustrated and described in relation to several specific embodiments thereof, those skilled in the art will readily recognize that variations in placement of parts may be made to suit specific requirements without departing from the spirit and scope of the invention.

What is claimed is:

1. A protection circuit for increasing the capability of a first transistor in a circuit including first and second terminals to withstand severe overvoltages in an automotive environment between said first and second terminals comprising:
   protection circuit means connected between a base and an emitter of said first transistor and also connected to said first terminal for increasing the breakdown voltage of said first transistor from its $BV_{CEO}$ breakdown voltage to its $BV_{CES}$ breakdown voltage in response to an overvoltage occurring between said first and second terminals;
   said protection circuit means including a second transistor having a collector connected to a base of said first transistor and an emitter connected to said second terminal, a plurality of reverse biased diode-connected transistors connected in series with a resistor, said resistor and said reverse biased diode-connected transistors being connected between said first terminal and a base of said second transistor, said first transistor having an emitter connected to said second terminal and a collector connected to said first terminal;
   wherein said first transistor is selected so that said $BV_{CEO}$ breakdown voltage is of sufficiently low magnitude that said first transistor would ordinarily be destroyed by said severe overvoltages in the absence of said protection circuit means, and said $BV_{CES}$ breakdown voltage is of sufficiently high magnitude that said first transistor will not be destroyed by said severe overvoltage.

2. A protection circuit as recited in claim 1, whereas, said resistor, said reverse biased diode-connected transistors and said second transistor are formed in a monolithic semiconductor die, and said first transistor is a discreet power transistor separate from said monolithic semiconductor die.

3. The protection circuit as recited in claim 1, further including a plurality of said first transistors and a plurality of said resistors, each of said resistors being connected, respectively, to a base of one of said first transistors.

4. The protective circuit as recited in claim 1 wherein said protection circuit is formed in a monolithic semiconductor die further comprising:
   a zener diode external to said monolithic semiconductor die;
   a second resistor external to said monolithic semiconductor die;
   said second resistor being coupled between said first terminal and a power conductor;
   said zener diode having its cathode coupled to said first terminal and its anode coupled to said second terminal.

5. A protection circuit for increasing the capability of a first transistor in an automotive electronic circuit including first and second terminals connected, respectively, to a B+ voltage conductor and a ground voltage conductor to withstand noise signals and load dump signals on said B+ conductor comprising:
   protection circuit means coupled between a base and an emitter of said first transistor and also connected to said first terminal for increasing the breakdown voltage of said first transistor from its $BV_{CEO}$ breakdown voltage to its $BV_{CES}$ breakdown voltage in response to said noise signals and load dump signals occurring on said B+ conductor, wherein said protection circuit means include;
   a second transistor;
   a plurality of diode-connected transistors connected in series with said resistor, said diode-connected transistors and said resistor being coupled in series between said first terminal and the base of said second transistor;
   said first transistor having an emitter coupled to said second terminal and a collector coupled to said first terminal, and a base coupled to a collector of said second transistor;
   said second transistor having an emitter coupled to said second terminal;
   said first transistor, said second transistor, said resistor, and said diode-connected transistors all being in a monolithic semiconductor die;

a zener diode external to said monolithic semiconductor die;

a second resistor external to said monolithic semiconductor die;

said second resistor being coupled between said first terminal and said B+ conductor, said zener diode having a cathode coupled to said first terminal and its anode coupled to said second terminal; said zener diode and said second resistor acting to limit the noise voltage on said B+ conductor;

wherein said first transistor is selected so that said $BV_{CEO}$ breakdown voltage is of sufficiently low magnitude that said first transistor would ordinarily be destroyed by said severe overvoltages in the absence of said protection circuit means, and said $BV_{CEO}$ breakdown voltage is of sufficiently high magnitude that said first transistor will not be destroyed by said severe overvoltage.

* * * * *